United States Patent
Lee et al.

(10) Patent No.: US 9,947,810 B2
(45) Date of Patent: Apr. 17, 2018

(54) SOLAR CELL AND SOLAR CELL PANEL INCLUDING THE SAME

(71) Applicant: LG ELECTRONICS INC., Seoul (KR)

(72) Inventors: Hyunho Lee, Seoul (KR); Jinsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 70 days.

(21) Appl. No.: 15/222,536

(22) Filed: Jul. 28, 2016

(65) Prior Publication Data

US 2017/0033243 A1    Feb. 2, 2017

(30) Foreign Application Priority Data

Jul. 28, 2015    (KR) .................. 10-2015-0106814

(51) Int. Cl.

| H01L 31/0224 | (2006.01) |
| H01L 31/02 | (2006.01) |
| H01L 31/05 | (2014.01) |
| H01L 31/0216 | (2014.01) |

(52) U.S. Cl.
CPC .. *H01L 31/022425* (2013.01); *H01L 31/0201* (2013.01); *H01L 31/02167* (2013.01); *H01L 31/0504* (2013.01); *H01L 31/0508* (2013.01); *Y02E 10/50* (2013.01)

(58) Field of Classification Search
CPC ....... H01L 31/022425; H01L 31/02167; H01L 31/0201; H01L 31/0504
See application file for complete search history.

(56) References Cited

U.S. PATENT DOCUMENTS

| 2011/0011440 | A1 | 1/2011 | Hioki et al. |
| 2013/0037102 | A1 | 2/2013 | Isaka |
| 2014/0130863 | A1* | 5/2014 | Saita .................. H01L 31/0504 136/256 |
| 2014/0238462 | A1 | 8/2014 | Jang et al. |
| 2014/0318613 | A1* | 10/2014 | Von Campe ........ H01L 31/0201 136/256 |

FOREIGN PATENT DOCUMENTS

| DE | 10 2009 026 027 A1 | 1/2011 |
| EP | 1 898 468 A1 | 3/2008 |
| EP | 2 511 957 A2 | 10/2012 |

(Continued)

*Primary Examiner* — Bethany L Martin
(74) *Attorney, Agent, or Firm* — Birch, Stewart, Kolasch & Birch, LLP

(57) ABSTRACT

Disclosed is a solar cell including a semiconductor substrate, a first conductive area formed on one surface of the semiconductor substrate, a second conductive area formed on a remaining surface of the semiconductor substrate, a first electrode connected to the first conductive area, and a second electrode connected to the second conductive area. The second electrode includes a pad portion and an electrode portion that include different conductive materials as main components. The pad portion includes at least one pad extending in a given direction, the wire being attached to the pad. The electrode portion and the pad are spaced apart from each other in the given direction so as to form a spacer therebetween.

17 Claims, 6 Drawing Sheets

(56) References Cited

FOREIGN PATENT DOCUMENTS

| | | |
|---|---|---|
| JP | 2011-233657 A | 11/2011 |
| JP | 2013-211341 A | 10/2013 |
| JP | 2014-165504 A | 9/2014 |
| JP | 2015-60349 A | 3/2015 |
| KR | 10-1195624 B1 | 10/2012 |
| KR | 10-1199424 B1 | 11/2012 |
| WO | WO 2013/129578 A1 | 9/2013 |
| WO | WO 2014/117216 A1 | 8/2014 |

* cited by examiner

SOLAR CELL AND SOLAR CELL PANEL INCLUDING THE SAME

CROSS-REFERENCE TO RELATED APPLICATION

This application claims the priority benefit of Korean Patent Application No. 10-2015-0106814, filed on Jul. 28, 2015 in the Korean Intellectual Property Office, the content of which is incorporated herein by reference.

BACKGROUND OF THE INVENTION

Field of the Invention

Embodiments of the present invention relate to a solar cell and a solar cell panel including the same, and more particularly, to a solar cell having an improved electrode structure and a solar cell panel including the same.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

A plurality of solar cells is connected to each other in series or in parallel using ribbons, and is manufactured into a solar cell panel via packaging, which is a process for protecting the solar cells. Because the solar cell panel needs to perform electricity generation for a long term in various environments, considerable long-term reliability is required.

When the solar cells are connected to each other using the ribbons, electrodes in the solar cells need to have a structure suitable for attachment of the ribbons. Otherwise, the attachment between the ribbons and the electrodes may be deteriorated, or manufacturing costs of the electrodes may increase.

SUMMARY OF THE INVENTION

Therefore, the embodiments of the present invention have been made in view of the above problems, and it is an object of the embodiments of the present invention to provide a solar cell and a solar cell panel including the same, which may achieve improved efficiency, productivity, and attachment of ribbons.

According to one aspect of the present invention, the above and other objects can be accomplished by the provision of a solar cell including a semiconductor substrate, a first conductive area formed on one surface of the semiconductor substrate, a second conductive area formed on a remaining surface of the semiconductor substrate, a first electrode connected to the first conductive area, and a second electrode connected to the second conductive area, wherein the second electrode includes a pad portion and an electrode portion that include different conductive materials as main components, wherein the pad portion includes at least one pad extending in a given direction, and wherein the electrode portion and the pad are spaced apart from each other in the given direction so as to form a spacer therebetween.

According to another aspect of the present invention, there is provided a solar cell panel including a plurality of solar cells, and a wire for interconnecting two neighboring solar cells among the solar cells, wherein each of the solar cells includes a semiconductor substrate, a first conductive area formed on one surface of the semiconductor substrate, a second conductive area formed on a remaining surface of the semiconductor substrate, a first electrode connected to the first conductive area, and a second electrode connected to the second conductive area, wherein the second electrode includes a pad portion and an electrode portion that include different conductive materials as main components, wherein the pad portion includes at least one pad extending in a given direction, the wire being attached to the pad, and wherein the electrode portion and the pad are spaced apart from each other in the given direction so as to form a spacer therebetween.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
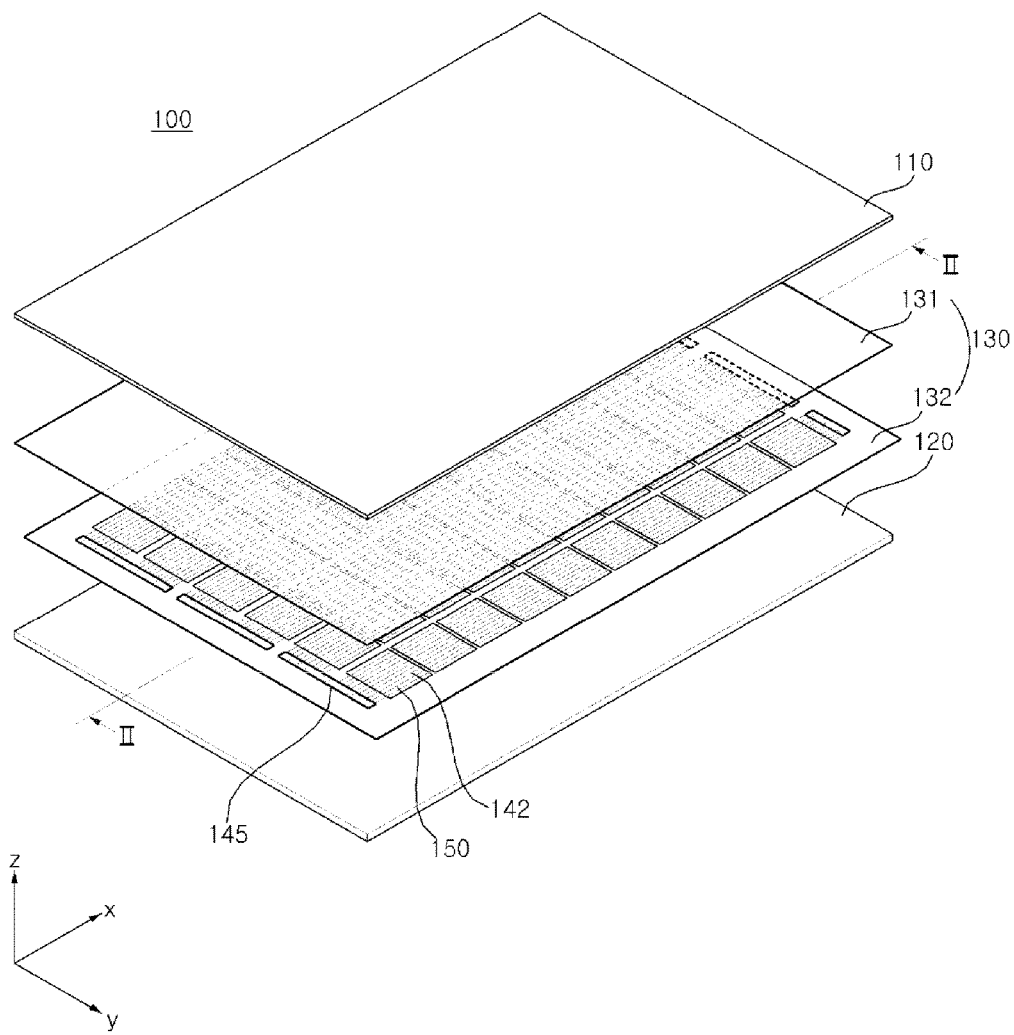
FIG. 1 is a perspective view illustrating a solar cell panel according to an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements having no connection with the description is omitted, and the same or similar elements are designated by the same reference numerals throughout the specification. In addition, in the drawings, for a more clear explanation, the dimensions of elements, such as thickness, width, and the like, may be exaggerated or reduced, and thus the thickness, width, and the like of the embodiments of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being on another element, it can be directly on the other element or intervening elements may also be present. On the other hand, when an element such as a layer, film, region or substrate is referred to as being "directly on" another element, this means that there are no intervening elements therebetween.

Hereinafter, a solar cell and a solar cell panel including the same according to the embodiments of the present invention will be described in detail with reference to the accompanying drawings. Here, the terms "first", "second", etc., are merely used in order to distinguish elements from each other, and the embodiments of the present invention are not limited thereto.

Figure 2:
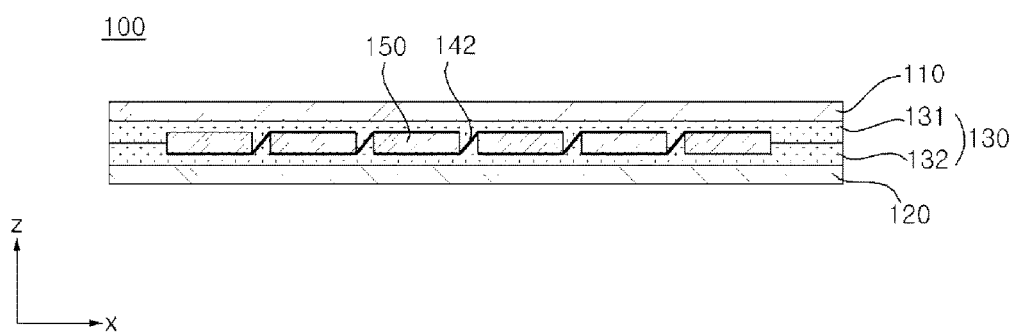
FIG. 2 is a sectional view taken along line II-II of FIG. 1.

FIG. 1 is a perspective view illustrating a solar cell panel according to an embodiment of the present invention, and FIG. 2 is a sectional view taken along line II-II of FIG. 1.

Referring to FIGS. 1 and 2, the solar cell panel according to the present embodiment, designated by reference numeral 100, includes a plurality of solar cells 150, and wires 142 for electrically interconnecting the solar cells 150. Further, the solar cell panel 100 includes a sealing member 130 for surrounding and sealing the solar cells 150 and the wires 142 for interconnecting the same, a front substrate 110 disposed on the front surface of the solar cells 150 above the sealing member 130, and a back substrate 120 disposed on the back surface of the solar cells 150 above the sealing member 130. This will be described below in more detail.

First, each of the solar cells 150 may include a photoelectric converter for converting sunlight into electrical energy, and an electrode electrically connected to the photoelectric converter for collecting and transmitting current. In addition, the solar cells 150 may be electrically interconnected in series and/or in parallel by the wires 142. Specifically, each wire 142 electrically interconnects two neighboring solar cells 150 among the solar cells 150.

In addition, bus ribbons 145 interconnect alternate ends of the wires 142, which connect the solar cells 150 to one another in rows (in other words, constituting solar cell strings). The bus ribbons 145 may be located on the ends of the solar cell strings so as to cross the solar cell strings. The bus ribbons 145 may interconnect the solar cell strings adjacent to each other, or may connect the solar cell string(s) to a junction box, which prevents the backflow of current. The material, shape, connection structure, and the like of the bus ribbons 145 may be altered in various ways, and the embodiment of the present invention is not limited as to them.

The sealing member 130 may include a first sealing member 131 disposed on the front surface of the solar cells 150 interconnected by the wires 142, and a second sealing member 132 disposed on the back surface of the solar cells 150. The first sealing member 131 and the second sealing member 132 prevent the introduction of moisture and oxygen, and realize a chemical bond between respective elements of the solar cell panel 100. The first and second sealing members 131 and 132 may be formed of an insulation material having light-transmissive and adhesive properties. In one example, the first sealing member 131 and the second sealing member 132 may be formed of ethylene vinyl acetate (EVA) copolymer resin, polyvinyl butyral, silicone resin, ester-based resin, or olefin-based resin. Through, for example, a lamination process using the first and second sealing members 131 and 132, the back substrate 120, the second sealing member 132, the solar cells 150, the first sealing member 131, and the front substrate 110 may be integrated with one another so as to construct the solar cell panel 100.

The front substrate 110 is disposed on the first sealing member 131 and configures the front surface of the solar cell panel 100. The back substrate 120 is disposed on the second sealing member 132 and configures the back surface of the solar cell panel 100. Each of the front substrate 110 and the back substrate 120 may be formed of an insulation material capable of protecting the solar cells 150 from external shocks, moisture, ultraviolet light, and the like. In addition, the front substrate 110 may be formed of a light-transmitting material capable of transmitting light, and the back substrate 120 may be configured as a sheet formed of a light-transmitting material, a material not transmitting light, or a material reflecting light. In one example, the front substrate 110 may be configured as a glass substrate, and the back substrate 120 may be a Tedlar/PET/Tedlar (TPT) substrate, or may include a polyvinylidene fluoride (PVDF) resin layer formed on at least one surface of a base film (e.g. a polyethyleneterephthlate (PET) film).

However, the embodiment of the present invention is not limited thereto. Thus, the first and second sealing members 131 and 132, the front substrate 110, or the back substrate 120 may include any of various materials excluding the above-described materials, and may have any of various shapes. For example, the front substrate 110 or the back substrate 120 may have any of various shapes (e.g. a substrate, film, or sheet), or may include any of various materials.

One example of the solar cell included in the solar cell panel and the wires connected thereto according to the embodiment of the present invention will be described below in detail with reference to FIG. 3.

Figure 3:
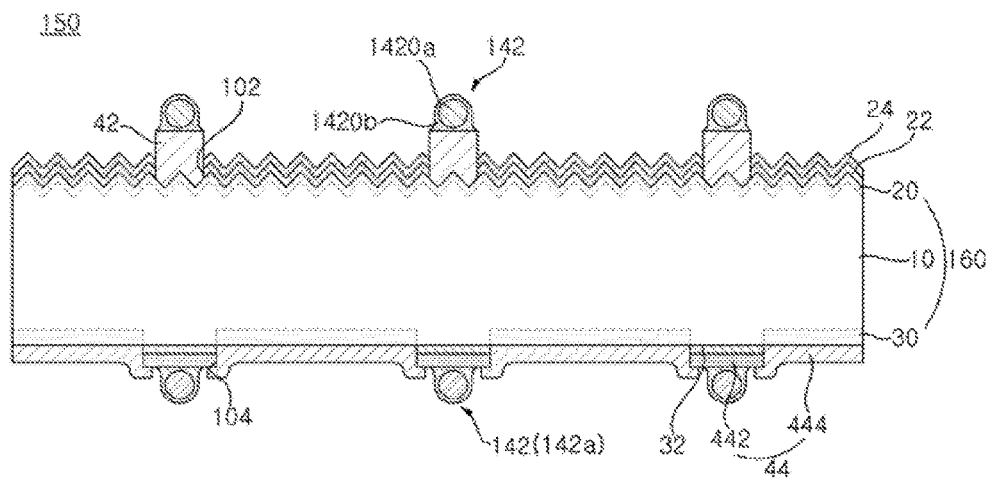
FIG. 3 is a partial sectional view illustrating one example of a solar cell included in the solar cell panel of FIG. 1 and wires connected thereto.

FIG. 3 is a partial sectional view illustrating one example of the solar cell included in the solar cell panel of FIG. 1 and the wires connected thereto.

Referring to FIG. 3, each solar cell 150 includes a semiconductor substrate 160, conductive areas 20 and 30 formed on or over the semiconductor substrate 160, and electrodes 42 and 44 connected to the conductive areas 20 and 30. The conductive areas 20 and 30 may include a first conductive area 20 of a first conductive type and a second conductive area 30 of a second conductive type. The electrodes 42 and 44 may include a first electrode 42 connected to the first conductive area 20 and a second electrode 44 connected to the second conductive area 30. The solar cell 150 may further include, for example, first and second passivation films 22 and 32, and an anti-reflection film 24.

The semiconductor substrate 160 may be formed of crystalline semiconductors including a single semiconductor material (e.g. group-IV elements). In one example, the semiconductor substrate 160 may be formed of monocrystalline or polycrystalline semiconductors (e.g. monocrystalline or polycrystalline silicon). More particularly, the semiconductor substrate 160 may be formed of monocrystalline semiconductors (e.g. a monocrystalline semiconductor wafer, and more specifically, a monocrystalline silicon wafer). The use of the semiconductor substrate 10 having high crystallinity and thus low defects ensures excellent electrical properties of the solar cell 150.

The front surface and/or the back surface of the semiconductor substrate 160 may be subjected to texturing so as to have protrusions. The protrusions may have a pyramidal shape having irregular sizes, and the outer surface of the protrusions may be (111) faces of semiconductors of the semiconductor substrate 160. When the roughness of, for example, the front surface of the semiconductor substrate 10 is increased by the protrusions formed on the front surface via texturing, the reflectance of light introduced through the front surface of the semiconductor substrate 160 may be reduced. Accordingly, the quantity of light, which reaches the pn junction formed by a base area 10 and the first or second conductive area 20 or 30, may be increased, which may minimize the loss of light. The present embodiment illustrates that protrusions are formed on each of the front surface and the back surface of the semiconductor substrate 160. However, the embodiment of the present invention is not limited thereto. Accordingly, protrusions may be formed on at least one of the back surface and the front surface of the semiconductor substrate 160, and may optionally not be formed on the front surface and the back surface of the semiconductor substrate 160.

In the present embodiment, the semiconductor substrate 160 may include the base area 10, which includes a first or second conductive dopant at a relatively low doping concentration, thus being of a first or second conductive type. At this time, the base area 10 of the semiconductor substrate 160 may have a lower doping concentration, higher resistance, or lower carrier concentration than one of the first and second conductive areas 20 and 30, which is of the same conductive type as the base area 10. In one example, in the present embodiment, the base area 10 may be of the second conductive type.

In addition, the semiconductor substrate 160 may include the first conductive area 20 and the second conductive area 30. In the present embodiment, the base area 10 and the conductive areas 20 and 30, which constitute the semiconductor substrate 160, are areas, which have the crystalline structure of the semiconductor substrate 160, are of different conductive types, and have different doping concentrations. For example, an area of the semiconductor substrate 160, which includes a first conductive dopant and thus is of a first conductive type, may be defined as the first conductive area 20, an area of the semiconductor substrate 160, which includes a second conductive dopant at a low doping concentration and thus is of a second conductive type, may be defined as the base area 10, and an area of the semiconductor substrate 160, which includes the second conductive dopant at a higher doping concentration than that in the base area 10 and thus is of the second conductive type, may be defined as the second conductive area 30.

In the present embodiment, the first conductive area may be formed throughout the front surface of the semiconductor substrate 160. Here, "formed throughout" includes not only a physically complete formation, but also formation with inevitably excluded parts. In this way, the first conductive area 20 may be formed to have a sufficient area without separate patterning. In addition, FIG. 3 illustrates that the first conductive area 20 has a homogeneous structure having a uniform doping concentration. However, the embodiment of the present invention is not limited thereto. Thus, in another embodiment, the first conductive area 20 may have a selective structure. In the selective structure, a portion of the first conductive area 20 proximate to the first electrode 42 may have a high doping concentration and low resistance, and the remaining portion of the first conductive area 20 may have a low doping concentration and high resistance.

In addition, the second conductive area 30 may have a local structure, which is locally formed so as to correspond to a portion of the second electrode 44. Thereby, the second conductive area 30 may be formed via a simple process. This will be described later in more detail. However, the embodiment of the present invention is not limited thereto, and the second conductive area 30 may have any of various structures, such as a homogeneous structure or a selective structure.

The first conductive area 20 may configure an emitter area, which forms a pn junction with the base area 10. The second conductive area 30 may configure a back-surface field area, which forms a back-surface field. The back-surface field area serves to prevent the loss of carriers due to recombination on the surface of the semiconductor substrate 160 (more accurately, the back surface of the semiconductor substrate 160).

In the present embodiment, the conductive areas 20 and are doped areas, which are formed by doping some inner areas of the semiconductor substrate 160 with dopants, thus constituting a portion of the semiconductor substrate 160. However, the embodiment of the present invention is not limited thereto. Accordingly, at least one of the first conductive area 20 and the second conductive area 30 may be configured as an amorphous, microcrystalline or polycrystalline semiconductor layer, which is a separate layer over the semiconductor substrate 160. Various alterations are possible.

The first conductive dopant, included in the first conductive area 20, may be an n-type or p-type dopant, and the second conductive dopant, included in the base area 10 and the second conductive area 30, may be a p-type or n-type dopant. The p-type dopant may be a group-III element, such as boron (B), aluminum (Al), gallium (ga), or indium (In), and the n-type dopant may be a group-V element, such as phosphorus (P), arsenic (As), bismuth (Bi), or antimony (Sb). The second conductive dopant in the base area 10 and the second conductive dopant in the second conductive area 30 may be the same material, or may be different materials.

In one example, the first conductive area 20 may be of an n-type, and the base area 10 and the second conductive area 30 may be of a p-type. As such, the second conductive area 30 may be easily formed. However, the embodiment of the present invention is not limited thereto. The base area 10 and the second conductive area 30 may be of a p-type, and the first conductive area 20 may be of an n-type.

Insulation films, such as the first and second passivation films 22 and 32 and anti-reflection film 24, may be formed over the surfaces of the semiconductor substrate 160. The insulation films may be configured as undoped insulation films, which include no dopant.

More specifically, the first passivation film 22 may be formed over (e.g. in contact with) the front surface of the semiconductor substrate 160, more accurately, over the first conductive area 20 formed on the semiconductor substrate 160, and the anti-reflection film 24 may be formed over (e.g. in contact with) the first passivation film 22. In addition, the second passivation film 32 may be formed over (e.g. in contact with) the back surface of the semiconductor substrate 160, more accurately, over the second conductive area 30 formed on the semiconductor substrate 160.

The first passivation film 22 and the anti-reflection film 24 may substantially be formed throughout the front surface of the semiconductor substrate 160 excluding a portion corresponding to the first electrode 42 (more accurately, a portion provided with a first opening 102). In the present embodiment, the second passivation film 32 may be formed on a portion of the semiconductor substrate 160, which corresponds to a portion of the second electrode 44. The second passivation film 32 will be described later in more detail.

The first and second passivation films 22 and 32 come into contact with the first and second conductive areas 20 and 30 for passivation of defects present in the surface or the bulk of the conductive areas 20 and 30. As such, it is possible to increase the open-circuit voltage of the solar cell 150 by removing recombination sites of minority carriers. The anti-reflection film 24 reduces the reflectance of light introduced into the front surface of the semiconductor substrate 160. This may increase the quantity of light, which reaches the pn junction formed at the interface of the base area 10 and the first conductive area 20. Thereby, the short-circuit current Isc of the solar cell 150 may be increased. In conclusion, the passivation films 22 and 32 and the anti-reflection film 24 may increase the open-circuit voltage and the short-circuit current of the solar cell 150, thereby improving the efficiency of the solar cell 150.

In one example, the passivation films 22 and 32 or the anti-reflection film 24 may include a single film or multiple films in the form of a combination of two or more films selected from the group consisting of a silicon nitride film, silicon nitride film containing hydrogen, silicon oxide film, silicon oxide nitride film, aluminum oxide film, $MgF_2$, ZnS, $TiO_2$, and $CeO_2$. In one example, the first or second passivation film 22 or 32 may include a silicon oxide film or silicon nitride film having a fixed positive charge when the conductive areas 20 and 30 are of an n-type, and may include an aluminum oxide film having a fixed negative charge when the conductive areas 20 and 30 are of a p-type. In one example, the anti-reflection film 24 may include silicon nitride.

However, the embodiment of the present invention is not limited thereto, and the passivation films 22 and 32 and the anti-reflection film 24 may include various materials. In addition, the stacking structure of the insulation films stacked over the front surface and/or the back surface of the semiconductor substrate 160 may be altered in various ways. For example, the insulation films may be stacked one above another in a stacking sequence different from the above-described stacking sequence. Alternatively, at least one of the first and second passivation films 22 and 32 and the anti-reflection film 24 may be omitted, or other insulation films excluding the first and second passivation films 22 and 32 and the anti-reflection film 24 may be provided. Various other alterations are possible.

The first electrode 42 is electrically connected to the first conductive area 20 through the first opening 102, which is formed in the insulation films disposed on the front surface of the semiconductor substrate 160 (e.g. the first passivation film 22 and the anti-reflection film 24). The second electrode 44 is electrically connected to the second conductive area 30 through a second opening 104, which is formed in the insulation film disposed on the back surface of the semiconductor substrate 110 (e.g. the second passivation film 32). In one example, the first electrode 42 may come into contact with the first conductive area 20, and the second electrode 44 may come into contact with the second conductive area 30.

The first and second electrodes 42 and 44 may be formed of various materials (e.g. metal materials) so as to have various shapes. The shapes of the first and second electrodes 42 and 44 will be described below with reference to FIG. 2.

As such, in the present embodiment, the first electrode 42 of the solar cell 150 may have a given pattern to increase the quantity of light introduced into the front surface, which is the surface to which a relatively large amount of light is introduced. In addition, the second electrode 44 may be formed throughout the back surface, which is the surface to which a relatively small amount of light is introduced, which may increase reflectance efficiency. Thereby, the quantity of light used in the solar cell 150 is increased, which may contribute to increase in the efficiency of the solar cell 150.

The solar cell 150 described above is electrically connected to a neighboring solar cell 150 by the wire 142, which is located over (e.g. in contact with) the first electrode 42 or the second electrode 44. This will be described below in more detail with reference to FIGS. 1 to 3 and FIG. 4.

Figure 4:
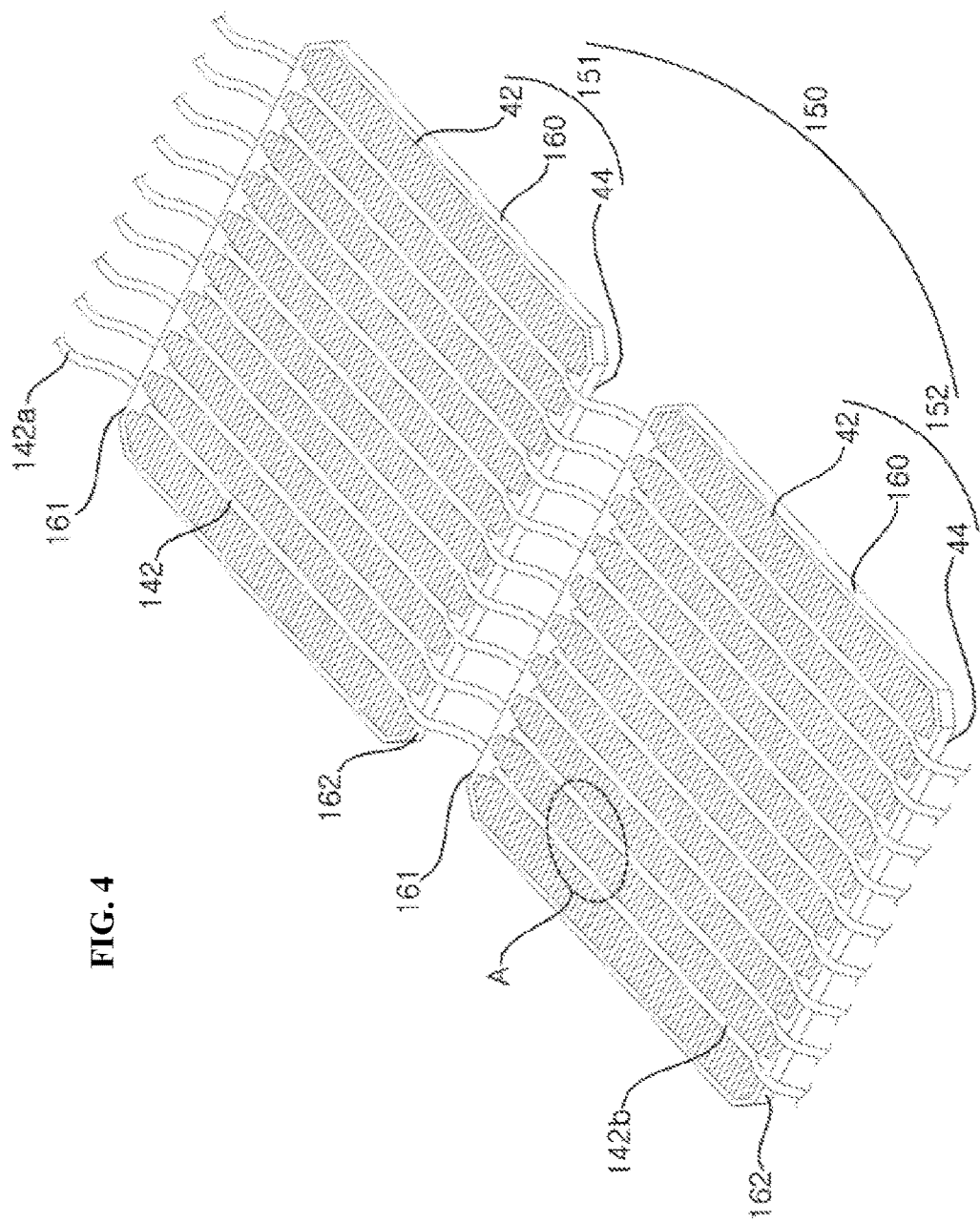
FIG. 4 is a perspective view schematically illustrating a first solar cell and a second solar cell, which are included in the solar cell panel of FIG. 1 and are connected to each other via the wires.

FIG. 4 is a perspective view schematically illustrating a first solar cell 151 and a second solar cell 152, which are included in the solar cell panel 100 of FIG. 1 and are connected to each other via the wire 142. In FIG. 4, the first and second solar cells 151 and 152 are schematically illustrated, and the illustration is focused on the semiconductor substrate 160 and the electrodes 42 and 44.

As illustrated in FIG. 4, two neighboring solar cells 150 (e.g. the first solar cell 151 and the second solar cell 152) among the solar cells 150 may be interconnected by the wire 142. At this time, the wire 142 interconnects the first electrode 42, which is disposed on the front surface of the first solar cell 151, and the second electrode 44, which is disposed on the back surface of the second solar cell 152, which is located on one side (the left lower side in FIG. 4) of the first solar cell 151. In addition, another wire 142a interconnects the second electrode 44, which is disposed on the back surface of the first solar cell 151, and the first electrode 42, which is disposed on the front surface of another solar cell, which may be located on the other side (the right upper side in FIG. 4) of the first solar cell 151. In addition, another wire 142b interconnects the first electrode 42, which is disposed on the front surface of the second solar cell 152, and the second electrode 44, which is disposed on the back surface of another solar cell, which may be located on one side (the left lower side in FIG. 4) of the second solar cell 152. In this way, the multiple solar cells 150 may be interconnected to form a single row by the wires 142, 142a and 142b. A following description related to the wire 142 may be applied to all of the wires 142, 142a and 142b, each of which interconnects two neighboring solar cells 150.

In the present embodiment, the wire 142 may include a first portion, a second portion, and a third portion. The first portion is connected to the first electrode (more specifically, a bus-bar line (see reference numeral 42b in FIG. 5) of the first electrode 42) and extends a long length from a first edge 161 to a second edge 162, which is opposite the first edge 161. The second portion is connected to the second electrode 44 (more specifically, pad portions 442 of the second electrode 44) on the back surface of the second solar cell 152 and extends a long length from the first edge 161 to the second edge 162, which is opposite the first edge 161. The third portion extends from the front surface of the first solar cell 151 to the back surface of the second solar cell 152 so as to connect the first portion and the second portion to each other. As such, the wire 142 may cross a region of the first solar cell 151, and then may cross a region of the second solar cell 152. When the wire 142 has a width smaller than the first and second solar cells 151 and 152 and is formed so as to correspond to the regions of the first and second solar cells 151 and 152 (e.g. the bus-bar line 42b), the wire 142 may effectively interconnect the first and second solar cells 151 and 152 despite a small area thereof.

In one example, the wire 142 may come into contact with the bus-bar line 42b of the first electrode 42 and the pad portion 442 of the second electrode 44 so as to extend a long length along the bus-bar line 42b and the pad portion 442. Thereby, the wire 142 and the first and second electrodes 42 and 44 may come into contact with each other at a sufficient area or sufficient length, which may improve electrical properties. However, the embodiment of the present invention is not limited thereto. The first electrode 42 may have no bus-bar line 42b, and in this case, the wire 142 may be in contact with and be connected to a plurality of finger lines (see reference numeral 42a in FIG. 5) so as to cross the finger lines 42a. Various other alterations are possible.

When viewing one surface of each solar cell 150, the multiple wires 142 may be provided to improve the electrical connection between neighboring solar cells 150. In particular, in the present embodiment, the wire 142 has a width smaller than a conventional ribbon having a relatively large width (e.g. within a range from 1 mm to 2 mm). As such, a greater number of wires 142 than the conventional ribbons (e.g. 2~5 wires) are used on one surface of each solar cell 150.

In one example, each wire 142 may include a core layer 1420a, which is formed of a metal, and a solder layer 1420b, which is coated over the surface of the core layer 1420a at a small thickness and includes a solder material so as to enable soldering with the electrodes 42 and 44. In one example, the core layer 1420a may include Ni, Cu, Ag or Al as a main material (e.g., a material included in an amount of 50 weight percents or more, more specifically, 90 weight percents or more). The solder layer 1420b may include Pb, Sn, SnIn, SnBi, SnPb, SnPbAg, SnCuAg or SnCu as a main material. However, the embodiment of the present invention is not limited thereto, and the core layer 1420a and the solder layer 1420b may include various other materials.

When the wire 142, which has a width smaller than the conventional ribbon, is used, material costs may be considerably reduced. In addition, because the wire 142 has a width smaller than the ribbon, a sufficient number of wires 142 may be provided to minimize the movement distance of carriers, which may enhance the output of the solar cell panel 100.

In addition, the wire 142 according to the present embodiment may include a rounded portion. That is, the wire 142 may have a circular, oval, or curvilinear cross section, or a rounded cross section. Thereby, the wire 142 may cause reflection or diffused reflection. In this way, light, reflected from the rounded surface of the wire 142 may be reflected or totally reflected by the front substrate 110 or the back substrate 120, which is disposed on the front surface or the back surface of the solar cell 150, to thereby be reintroduced into the solar cell 150. This may effectively enhance the output of the solar cell panel 100. However, the embodiment of the present invention is not limited thereto. Accordingly, the wire 142 may have a polygonal shape, such as a rectangular shape, or may have any of various other shapes.

In the present embodiment, the width (or the diameter) of the wire 142 may range from 250 $\mu$m to 500 $\mu$m. For reference, in the present embodiment, because the thickness of the solder layer 1420b may be very small thickness and may have any of various values depending on the position of the wire 142, the width of the wire 142 (see reference character W in FIG. 5) may be the width of the core layer 1420a. Alternatively, the width W of the wire 142 may be determined so that the wire 142 is located over a line portion (see reference numeral 421 in FIG. 5) so as to pass through the center of the line portion. The wire 142 having the above-described width may efficiently transfer current, generated in the solar cell 150, to an external circuit (e.g. a bus ribbon or a bypass diode of a junction box) or another solar cell 150. In the present embodiment, the wires 142 may be individually positioned over and fixed to the electrodes 42 and 44 of the solar cell 150 without being inserted into, for example, a separate layer or film. When the width W of the wires 142 is below 250 $\mu$m, the strength of the wire 142 may be insufficient and the connection area between the wires 142 and the electrodes 42 and 44 may be very small, which may result in poor electrical connection and low attachment force. When the width W of the wires 142 exceeds 500 $\mu$m, the cost of the wires 142 may increase, and the wires 142 may prevent light from being introduced into the front surface of the solar cell 150, thereby increasing shading loss. In addition, the wires 142 may receive force so as to be spaced apart from the electrodes 42 and 44, which may cause low attachment force between the wires 142 and the electrodes 42 and 44 and may generate cracks in the electrodes 42 and 44 or the semiconductor substrate 160. In one example, the width W of the wires 142 may range from 350 $\mu$m to 450 $\mu$m (more particularly, from 350 $\mu$m to 400 $\mu$m). With this range, the wires 142 may achieve increased attachment force for the electrodes 42 and 44 and may enhance the output of the solar cell panel 100.

At this time, three to thirty-three wires 142 may be provided on one surface of the solar cell 150. More specifically, when the width W of the wires 142 is 250 $\mu$m or more and below 300 $\mu$m, the number of the wires 142 may range from 15 to 33. When the width W of the wires 142 is 300 $\mu$m or more and below 350 $\mu$m, the number of the wires 142 may range from 10 to 33. When the width W of the wires 142 is 350 $\mu$m or more and below 400 $\mu$m, the number of the wires 142 may range from 8 to 33. When the width W of the wires 142 ranges from 400 $\mu$m to 500 $\mu$m, the number of the wires 142 may range from 6 to 33. In addition, when the width W of the wires 142 is 350 $\mu$m or more, the output of the solar cell panel 100 is no longer increased even if the number of the wires 142 exceeds 15. In addition, when the number of the wires 142 increases, this may increase burden on the solar cell 150. In consideration of this, when the width W of the wires 142 is 350 $\mu$m or more and below 400 $\mu$m, the number of the wires 142 may range from 8 to 15. When the width W of the wires 142 ranges from 400 $\mu$m to 500 $\mu$m, the number of the wires 142 may range from 6 to 15. At this time, in order to further enhance the output of the solar cell panel 100, the number of the wires 142 may be 10 or more (e.g. 12 or 13). However, the embodiment of the present invention is not limited thereto, and the number of the wires 142 and the number of the bus-bar lines 42b may have various other values.

At this time, the pitch of the wires 142 (or the pitch of the bus-bar lines 42b or the pad portions 442) may range from 4.75 mm to 26.13 mm. This is acquired in consideration of the width W and the number of the wires 142. For example, when the width W of the wires 142 is 250 $\mu$m or more and below 300 $\mu$m, the pitch of the wires 142 may range from 4.75 mm to 10.45 mm. When the width W of the wires 142 is 300 $\mu$m or more and below 350 $\mu$m, the pitch of the wires 142 may range from 4.75 mm to 15.68 mm. When the width W of the wires 142 is 350 $\mu$m or more and below 400 $\mu$m, the pitch of the wires 142 may range from 4.75 mm to 19.59 mm. When the width W of the wires 142 ranges from 400 $\mu$m to 500 $\mu$m, the pitch of the wires 142 may range from 4.75 mm to 26.13 mm. More specifically, when the width W of the wires 142 is 350 $\mu$m or more and below 400 $\mu$m, the pitch of the wires 142 may range from 10.45 mm to 19.59 mm. When the width W of the wires 142 ranges from 400 $\mu$m to 500 $\mu$m, the pitch of the wires 142 may range from 10.45 mm to 26.13 mm. However, the embodiment of the present invention is not limited thereto, and the pitch of the wires 142 and the pitch of the bus-bar lines 42b may have various other values.

The present embodiment exemplifies that the wires 142 have the above-described width and the rounded shape and are provided in the number described above, thereby enhancing the output of the solar cell panel 100. However, the embodiment of the present invention is not limited thereto, and the width W, the number, the pitch, and the shape of the wires 142 may be altered in various ways.

In the present embodiment, for example, the first electrode 42 (or the second electrode 44), the wire 142, and an electrode area (see reference character EA in FIG. 5) may be symmetrically arranged in the first direction (e.g., the direction parallel to the finger lines 42a) and the second direction (e.g., the direction parallel to the bus-bar lines 42b or the wires 142). Thereby, the flow of current may be stabilized. However, the embodiment of the present invention is not limited thereto.

One example of the electrodes 42 and 44 of the solar cell 150, to which the wires 142 according to the embodiment of the present invention may be attached, will be described below in detail with reference to FIGS. 1 to 4 and FIGS. 5 to 7. Hereinafter, the first electrode 42 will be described in detail with reference to FIG. 5, and then the second electrode 44 will be described in detail with reference to FIGS. 6 and 7.

Figure 5:
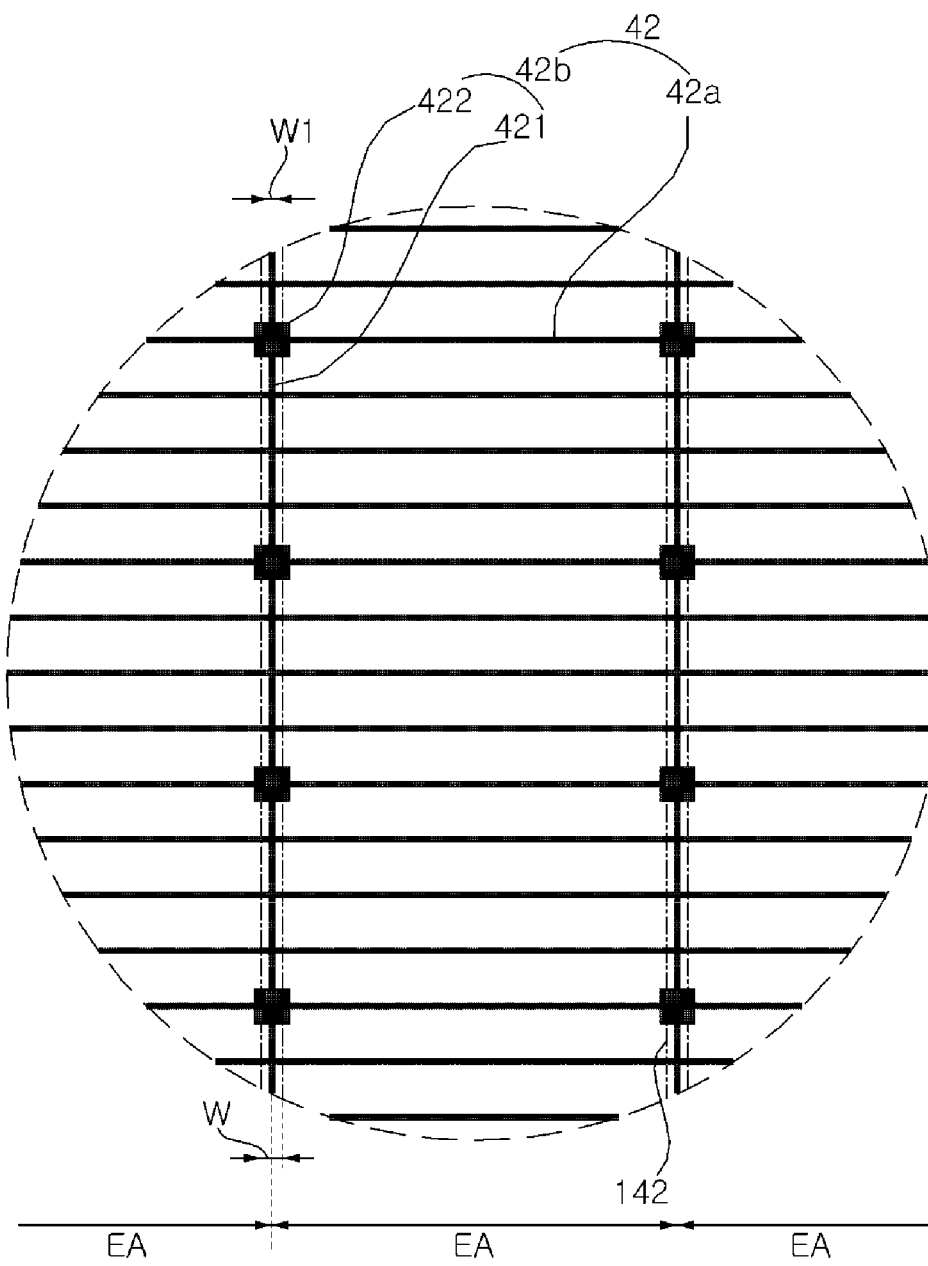
FIG. 5 is a partial front plan view illustrating portion A of FIG. 4 in an enlarged scale.

FIG. 5 is a partial front plan view illustrating portion A of FIG. 4 in an enlarged scale.

Referring to FIGS. 1 to 5, in the present embodiment, the first electrode 42 includes the finger lines 42a, which extend in the first direction (e.g., the horizontal direction in the drawings) and are arranged parallel to each other. The first electrode 42 may further include the bus-bar lines 42b, which extend in the second direction (e.g., the vertical direction in the drawings) crossing (e.g. perpendicular to) the finger lines 42a and are connected or attached to the wires 142. Because the bus-bar lines 42b may be arranged so as to correspond to the wires 142, the description related to the number and the pitch of the wires 142 may be directly applied to the number and the pitch of the bus-bar lines 42b. Hereinafter, an area between two neighboring bus-bar lines 42b among the bus-bar lines 42b or an area between the bus-bar line 42b and the edge of the solar cell 150 is referred to as the electrode area EA. In the present embodiment, because the multiple (e.g. 6 or more) wires 142 are provided on one surface of the solar cell 150, a plurality of electrode areas EA (provided in the number greater than the number of the wires 142 by one) may be provided.

The finger lines 42a may have a consistent width, and may be spaced apart from one another at a consistent pitch. Although FIG. 5 illustrates that the finger lines 42a are formed parallel to each other in the first direction and are parallel to the main edges (more particularly, the first and second edges 161 and 162) of the solar cell 150, the embodiment of the present invention is not limited thereto.

In one example, the finger lines 42a of the first electrode 42 may have the width ranging from 35 μm to 120 μm and may have the pitch ranging from 1.2 mm to 2.8 mm, and the number of the finger lines 42a may range from 55 to 130 in the direction crossing the finger lines 42a. The width and the pitch of the finger lines 42a may be determined based on easy process conditions, and may be limited to minimize shading loss due to the finger lines 42a while ensuring the effective collection of current generated via photoelectric conversion. The thickness of the finger lines 42a may be within the range in which the finger lines 42a may be formed via an easy process and may have a desired specific resistance. However, the embodiment of the present invention is not limited thereto, and the width and the pitch of the finger lines 42a may be changed in various ways depending on, for example, variation in process conditions, the size of the solar cell 150, and the constituent material of the finger lines 42a.

At this time, the width W of the wires 142 may be smaller than the pitch of the finger lines 42a, and may be greater than the width of the finger lines 42a. However, the embodiment of the present invention is not limited thereto, and various alterations are possible.

In one example, the bus-bar lines 42b may be successively formed from the position proximate to the first edge 161 to the position proximate to the second edge 162 on a per electrode area EA basis. As mentioned above, the bus-bar lines 42b may be located so as to correspond to the wires 142, which are used to connect the respective neighboring solar cells 150. The bus-bar lines 42b may correspond to the wires 142 in a one-to-one ratio. As such, in the present embodiment, the number of the bus-bar-lines 42b may be the same as the number of the wires 142 on one surface of the solar cell 150.

Each bus-bar line 42b may include the line portion 421, which has a relatively small width and extends a long length in the direction in which it is connected to the wire 142 within the electrode area EA, and a pad portion 422, which has a width greater than the line portion 421 so as to increase the area of connection for the wire 142. The line portion 421 having a small width may minimize the area by which light is blocked so as not to be introduced into the solar cell 150, and the pad portion 422 having a large width may increase the attachment force between the wire 142 and the bus-bar line 42b and may reduce contact resistance. The pad portion 422 has a width greater than the line portion 421, and thus substantially serves as a region for the attachment of the wire 142. The wire 142 may be attached to the line portion 421, or may be simply placed on the line portion 421 without being attached thereto.

The width of the pad portion 422, measured in the first direction, may be greater than the width of each of the line portion 421 and the finger line 42a.

The present embodiment exemplifies that the line portion 421 of the bus-bar line 42b is provided so as to correspond to the wire 142. More specifically, although a bus-bar electrode, which is significantly wider than the finger line 42a, is provided to correspond to the wire 142 in the related art, in the present embodiment, the line portion 421 of the bus-bar line 42b, which has a width significantly smaller than the bus-bar electrode, is provided. In the present embodiment, the line portion 421 may connect the finger lines 42a to one another so as to provide a bypass path for carriers when some finger lines 42a are disconnected.

In this specification, the bus-bar electrode refers to an electrode portion, which is formed in the direction crossing the finger lines so as to correspond to the ribbon and has a width twelve times or more (usually, fifteen times or more) the width of the finger lines. Two or three bus-bar electrodes are usually provided because the bus-bar electrodes have a relatively large width. In addition, in the present embodiment, the line portion 421 of the bus-bar line 42b may refer to an electrode portion, which is formed in the direction crossing the finger lines 42a so as to correspond to the wire 142 and has a width ten times or less the width of the finger line 42a.

In one example, the width W1 of the line portion 421 may range from 0.5 times to 10 times the width of the finger line 42a. When the ratio is below 0.5 times, the width W1 of the line portion 421 may be too small to allow the line portion 421 to exert sufficient effects. When the ratio exceeds 10 times, the width W1 of the line portion 421 may be excessive, causing increased shading loss. In particular, in the present embodiment, because a great number of wires 142 are provided, the line portions 421 are also provided in a great number, which may further increase shading loss. More specifically, the width W1 of the line portion 421 may range from 0.5 times to 7 times the width of the finger line 42a. When the ratio is 7 times or less, shading loss may further be reduced. In one example, in terms of shading loss, the width W1 of the line portion 421 may range from 0.5 times to 4 times the width of the finger line 42a. More specifically, the width W1 of the line portion 421 may range from 0.5 times to 2 times the width of the finger line 42a. With this range, the efficiency of the solar cell 150 may be greatly increased.

Alternatively, the width W1 of the line portion 421 may be equal to or smaller than the width W of the wire 142. This is because the width or area by which the lower surface of the wire 142 comes into contact with the line portion 421 is not large when the wire 142 has a circular, oval or rounded shape. When the line portion 421 has a relatively small width W1, the area of the first electrode 42 may be reduced, resulting in a reduction in the manufacturing costs of the first electrode 42.

In one example, the ratio of the width W of the wire 142 to the width W1 of the line portion 421 may range from 1:0.07 to 1:1. When the ratio is below 1:0.07, the width W1 of the line portion 421 is excessively small, causing deterioration in electrical properties. When the ratio exceeds 1:1, the area of the first electrode 42 is increased, causing increased shading loss and material costs without considerable improvement in the contact between the wire 142 and the line portion 421. In one example, the ratio may range from 1:01 to 1:0.5 (more specifically, from 1:0.1 to 1:0.3) when further considering the shading loss and the material costs.

Alternatively, the width W1 of the line portion 421 may range from 35 μm to 350 μm. When the width W1 of the line portion 421 is below 35 μm, the width W1 of the line portion 421 is excessively small, causing deterioration in electrical properties. When the width W1 of the line portion 421 exceeds 350 μm, the area of the first electrode 42 is excessive, causing increased shading loss and material costs without considerable improvement in the contact between the wire 142 and the line portion 421. In one example, the width W1 of the line portion 421 may range from 35 μm to 200 μm (more specifically, from 35 μm to 120 μm) when further considering the shading loss and the material costs.

However, the embodiment of the present invention is not limited thereto. Accordingly, the width W1 of the line portion 421 may be changed in various ways within the range in which the line portion 421 effectively transfers current generated via photoelectric conversion and minimizes shading loss.

In addition, the width of the pad portion 422 may be greater than the width W1 of the line portion 421, and may be equal to or greater than the width W of the wire 142. Because the pad portion 422 serves to increase force for the attachment of the wire 142 by increasing the contact area of the wire 142, the width of the pad portion 422 may be greater than the width of the line portion 421, and may be equal to or greater than the width of the wire 142.

In one example, the ratio of the width W of the wire 142 to the width of the pad portion 422 may range from 1:1 to 1:5. When the ratio is below 1:1, the width of the pad portion 422 may be insufficient, causing insufficient attachment force between the pad portion 422 and the wire 142. When the ratio exceeds 1:5, the area by which the pad portion 422 causes shading loss may be increased, resulting in greater shading loss. The ratio may range from 1:2 to 1:4 (more specifically, 1:2.5 to 1:4) when further considering the attachment force and the shading loss.

Alternatively, in one example, the width of the pad portion 422 may range from 0.25 mm to 2.5 mm. When the width of the pad portion 422 is below 0.25 mm, the contact area between the pad portion 422 and the wire 142 may be insufficient, and consequently, the attachment force between the pad portion 422 and the wire 142 may be insufficient. When the width of the pad portion 422 exceeds 2.5 mm, the area by which the pad portion 422 causes shading loss may be increased, resulting in greater shading loss. In one example, the width of the pad portion 422 may range from 0.8 mm to 1.5 mm.

In addition, the length of the pad portion 422 may be greater than the width of the finger line 42a. For example, the length of the pad portion 422 may range from 0.035 mm to 30 mm. When the length of the pad portion 422 is below 0.035 mm, the contact area between the pad portion 422 and the wire 142 may be insufficient, and consequently, the attachment force between the pad portion 422 and the wire 142 may be insufficient. When the length of the pad portion 422 exceeds 30 mm, the area by which the pad portion 422 causes shading loss may be increased, resulting in greater shading loss.

Alternatively, in one example, the ratio of the width of the finger line 42a to the length of the pad portion 422 may range from 1:1.1 to 1:20. With this range, the area for attachment between the pad portion 422 and the wire 142 is increased, and consequently, the attachment force between the pad portion 422 and the wire 142 may be increased.

Alternatively, in one example, the ratio of the width W of the wire 142 to the length of the pad portion 422 may range from 1:1 to 1:10. When the ratio is below 1:1, the length of the pad portion 422 may be insufficient, causing insufficient attachment force between the pad portion 422 and the wire 142. When the ratio exceeds 1:10, the area by which the pad portion 422 causes shading loss may be increased, resulting in greater shading loss. The ratio may range from 1:3 to 1:6 when further considering the attachment force and the shading loss.

One bus-bar line 42b may include six to twenty-four pad portions 422 (e.g. twelve to twenty-two pad portions). The pad portions 422 may be spaced apart from one another. In one example, one pad portion 422 may be allotted to two to ten finger lines 42a. Thereby, the portion in which the contact area between the bus-bar line 42b and the wire 142 is increased is provided at a regular interval so as to increase the attachment force between the bus-bar line 42b and the wire 142. Alternatively, the pad portions 422 may be arranged so that distances between the respective two pad portions 422 have different values. In particular, the pad portions 422 may be arranged at a high density on the end of the bus-bar line 42b, to which greater force is applied than in the other portion (e.g., the central portion of the bus-bar line 42b). Various alterations are possible.

The second conductive area 30, the second passivation film 32, and the second electrode 44 will be described in detail with reference to FIGS. 6 and 7.

Figure 6:
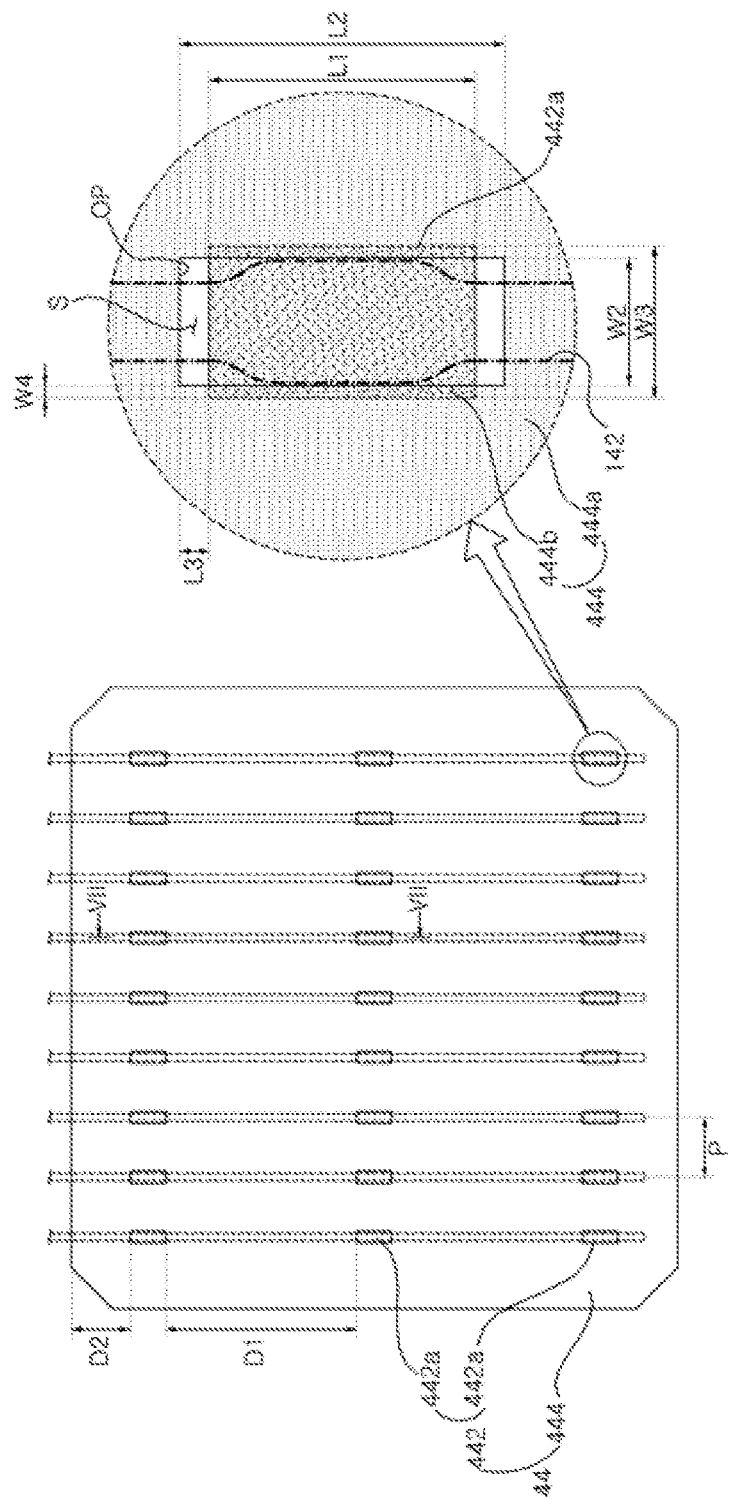
FIG. 6 is a rear plan view illustrating the solar cell of FIG. 4.
Figure 7:
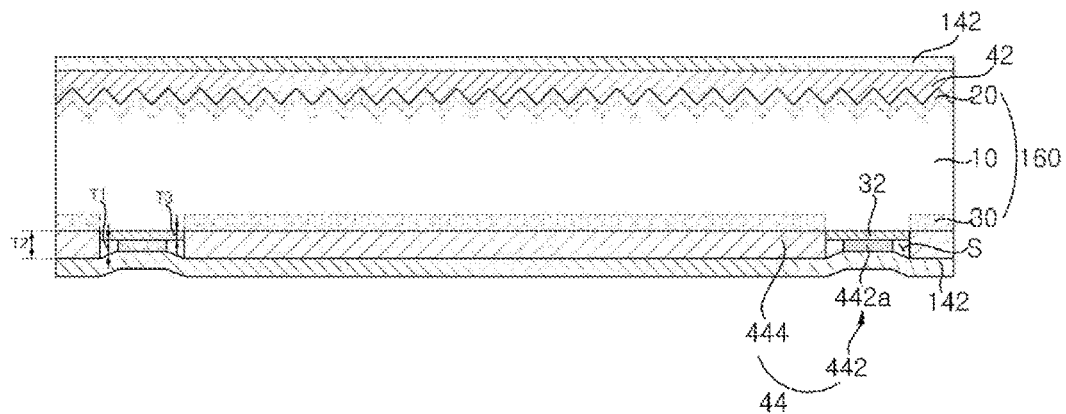
FIG. 7 is a sectional view taken along line VII-VII of FIG. 6.

FIG. 6 is a rear plan view illustrating the solar cell 150 of FIG. 4, and FIG. 7 is a sectional view taken along line VII-VII of FIG. 6.

Referring to FIGS. 6 and 7, the second electrode 44 may be formed substantially throughout the back surface of the semiconductor substrate 160 excluding spacers S. Here, "formed throughout" includes not only a physically complete formation, but also formation with inevitably excluded parts. For example, the second electrode 44 may be formed throughout the back surface of the semiconductor substrate 160 so as to be spaced apart from the edge of the back surface by a given distance.

Accordingly, in the present embodiment, the second electrode 44 has a shape different from the first electrode 42, and the area rate of the second electrode 44 may be greater than the area rate of the first electrode 42. For example, assuming that the area of the semiconductor substrate 160 is 100%, the area rate of the second electrode 44 may range from 90% to 100% (e.g. from 95% to 100%). However, the embodiment of the present invention is not limited thereto.

Because a smaller quantity of light is introduced into the back surface of the semiconductor substrate 160 than in the front surface, reflecting light introduced into the front surface of the semiconductor substrate 160, into which a relatively great quantity of light is introduced, so as to reuse the light in the solar cell 150 may be more advantageous in terms of efficiency, compared to introduce light into the back surface of the semiconductor substrate 160. Accordingly, in the present embodiment, the second electrode 44 is formed throughout the back surface of the semiconductor substrate 160 so that most of light, having passed through the semiconductor substrate 160 to thereby reach the back surface, is reflected to the front surface of the semiconductor substrate 160 so as to be reused. Thereby, the efficiency of the solar cell 150 may be increased.

In the present embodiment, the second electrode 44 may include a pad portion 422 and an electrode portion 444, which include different conductive materials as main components. At this time, the spacer S may be located between the electrode portion 444 and the pad portion 442 (more accurately, a pad 442a), which are spaced apart from each other in the second direction.

The pad portion 442 is the area to which the wire 142 for connection with a neighboring solar cell 150 is attached or adhesively bonded. As described above, the wire 142, which extends a long length, is attached or adhesively bonded to the bus-bar line 42b of the first electrode 42 of one solar cell 150 and to the pad portion 442 of the second electrode 44 of another neighboring solar cell 150, thereby connecting the two neighboring solar cells 150 to each other.

In addition, the electrode portion 444 is connected to (e.g. in contact with) the second conductive area 30 and serves to collect carries produced by the second conductive area 30. The electrode portion 444 may be formed throughout a region excluding the spacers S and the pad portions 442. Accordingly, the electrode portion 444 may be formed throughout the semiconductor substrate 160, and may have openings OP for exposing at least a portion of the semiconductor substrate 160 corresponding to the pad portions 442. At this time, when the electrode portion 444 includes a conductive material that may function as a second conductive dopant as in the present embodiment, the electrode portion 444 may also serve to form the second conductive area 30 via thermal diffusion.

The pad portions 442 may include a conductive material (e.g. a metal material), which exhibit excellent electrical conductivity and excellent attachment force between the pad portion 442 and the wire 142, and the electrode portion 444 may include a conductive material (e.g. a metal material), which may easily form the second conductive area 30 in the state in which the second passivation film 32 is subjected to a fire-through process via thermal treatment. In one example, the pad portions 442 may include silver, and the electrode portion 444 may include aluminum, which is a group-III element and may function as a second conductive dopant. The electrode portion 444 may include, as a main component (a material included in the largest quantity, e.g., a component of 50 weight percent or more), a single conductive material, such as aluminum, or may include, as a main component, an aluminum-silicon alloy, which is produced via reaction with a semiconductor material (e.g. silicon) constituting the semiconductor substrate 160. In addition, the pad portions 442 may include silver as a main component.

In the present embodiment, the area of the electrode portion 444 may be greater than the area of the pad portions 442. Thereby, the electrode portion 444, which substantially collects carriers, may have a sufficient area. In addition, when the electrode portion 444 has a large area, the second conductive area 30, which has a shape corresponding to the electrode portion 444, may have a large area. Thereby, recombination on the back surface of the semiconductor substrate 160 may be prevented, which may increase the efficiency of the solar cell 150. The pad portion 442 may be formed only on the portion of the second electrode 44 connected to the wire 142, which may increase the attachment force (tabbing) between the second electrode 44 and the wire 142.

In one example, assuming that the area of the semiconductor substrate 160 is 100%, the area rate of the pad portions 442 of the second electrode 44 may be smaller than the area rate of the first electrode 42. For example, assuming that the area of the semiconductor substrate 160 is 100%, the area rate of the pad portions 442 may range from 1% to 5% (e.g. from 2% to 3%). This is because each pad portion 442 has no portion corresponding to the finger lines and is formed so as to correspond to only the wire 142. When the area rate of the pad portions 442 is below 1%, connection between the pad portion 442 and the wire 142 may be deteriorated. When the area rate of the pad portions 442 exceeds 5%, the area of the electrode portion 444 may be reduced, and consequently, the area of the second conductive area 30 may be reduced. In order to achieve more excellent effects, the area rate of the pad portion 442 may range from 2% to 3%.

The width W2 (e.g., the width in the first direction) of the pad portion 442 of the second electrode 44 may be greater than the width W1 of the line portion 421 of the bus-bar line 42b of the first electrode 42. This is because the line portion 421 of the bus-bar line 42b is located on the front surface of the semiconductor substrate 160, into which light is introduced, and therefore, increase in the width of the line portion 421 is limited. In one example, the width W2 of the pad portion 442 may range from 1 mm to 2.5 mm, and as described above, the width W1 of the line portion 421 of the bus-bar line 42b of the first electrode 42 may range from 35 μm to 350 μm. This is because the pad portion 442 and the wire 142 may be smoothly connected to each other in this range. However, the embodiment of the present invention is not limited thereto, and the width W2 of the pad portion 442 and the width W1 of the line portion 421 of the bus-bar line 42b may have various other values.

In the present embodiment, the pad portion 442 may be located so as to extend in the second direction (e.g., the direction parallel to the bus-bar line 42b, or the direction crossing (e.g. perpendicular to) the finger line 42a) (e.g., the vertical direction in FIG. 5). In addition, the multiple pad portions 442 may be arranged at a constant pitch P in the first direction (e.g., the horizontal direction in the drawing) crossing the longitudinal direction (e.g., the second direction) of the pad portions 442. At this time, the pad portions 442 of the second electrode 44 may be arranged at positions corresponding to the respective bus-bar lines 42b or the respective wires 142 of the first electrode 42 in a one-to-one ratio. That is, the bus-bar line 42b of the first electrode 42 and the pad portion 442 of the second electrode 44 may be located at substantially the same position with the semiconductor substrate 160 interposed therebetween.

At this time, each pad portion 442 located in the second direction may include at least one pad 442a, which extends in the second direction. In one example, each pad portion 442 may include a plurality of pads 442a spaced apart from one another in the second direction so as to form a single row. Each pad 442a may take the form of an island having a closed shape. In addition, the electrode portion 444 may be integrally formed in a portion excluding the openings OP, which correspond to the respective pads 442a in a one-to-one ratio.

The pad portion 442 may be formed of a higher price material than the electrode portion 444. When the pad portion 442 includes the pads 442a spaced apart from one another as described above, the quantity of a constituent material of the pad portion 442 may be reduced, resulting in reduced manufacturing costs. In addition, the electrode portion 444 may have a sufficient area, and consequently, the second conductive area 30 may have a sufficient area.

In one example, one pad portion 442 may include one to ten pads 442a, thus maintaining excellent connection with the wire 142. At this time, one pad portion 442 includes three to ten pads 442a so as to reduce the sum of lengths of the pads 442a, which constitute one pad portion 422. Thereby, the manufacturing costs of the pad portion 442 may be reduced. When the number of pads 442a is increased, the length of each pad 442a may be reduced, which may deteriorate the connection between the pad 442a and the wire 142. In consideration of this, one pad portion 442 may include three to six pads 442a so as to achieve excellent connection with the wire 142 and to reduce the manufacturing costs thereof. However, the embodiment of the present invention is not limited thereto, and the number of pads 442a, which constitute one pad portion 442, may be changed depending on, for example, the size of the semiconductor substrate 160, and the constituent material and the width of the wire 142.

In addition, the distance D1 between the neighboring pads 442a may be within a range in which the strength of attachment between the pads 442a and the wire 142 is not reduced. For example, the distance D1 between the two neighboring pads 442a may range from 2.5 cm to 4.5 cm. This range is determined to minimize the area of the pad portion 442 without deterioration in the strength of attachment between the pad portion 442 and the wire 142. The pad 442a, which is proximate to the edge of the semiconductor substrate 160, may be spaced apart from the edge of the semiconductor substrate 160 by a given distance D2. In one example, the distance D2 between the edge of the semiconductor substrate 160 and the end of the pad 442a proximate to the edge may range from 1 cm to 2 cm. When the distance D2 is below 1 cm, for example, unnecessary shunt may occur when an alignment error occurs, and the area of the pad portion 442 may be unnecessarily increased. When the distance D2 exceeds 2 cm, the strength of attachment between the pad portion 442 and the wire 142 may be greatly reduced on the end of the pad portion 442.

The distance D1 between the neighboring pads 442a, which is greater than the distance D2 between the edge of the semiconductor substrate 160 and the pad 442a, is exemplified in the drawings and the above description. This minimizes the area of the pad portion 442 while minimizing a reduction in the strength of attachment between the pad portion 442 and the wire 142. However, the embodiment of the present invention is not limited thereto, and the distances D1 and D2 may have various other values.

The electrode portion 444 may include, in the region excluding the spacers S and the pad portions 442, a proximate portion 444a, which is proximate to or in contact with the semiconductor substrate 160 or the second conductive area 30, and an overlap portion 444b, which overlaps (e.g. in contact with) a portion of the pad portion 442. In addition, a portion of the proximate portion 444a may be spaced apart from the pad portion 442 (more specifically, the pad 442a) so that the spacer S is located between the pad 422a and the proximate portion 444a. The overlap portion 444b may be intentionally formed to improve the connection with the pad portion 442 in consideration of a process error (process margins or process margin of error), and may be naturally formed based on the process error.

When the electrode portion 444 overlaps a portion of each pad portion 442, the proximate portion 444a of the electrode portion 444 may be disposed on (e.g. in contact with) the semiconductor substrate 160 or the second conductive area 30, and the overlap portion 444b of the electrode portion 444 may be spaced apart from the semiconductor substrate 160 or the second conductive area 30 and may be disposed on (e.g. in contact with) the pad portion 442. That is, the pad portion 442 may first be formed on the semiconductor substrate 160, and thereafter the electrode portion 444 may be formed. This is because the pad portion 442 including silver may not be easily peeled off when it is proximate to the semiconductor substrate 160, but may be easily peeled off when it is disposed on the electrode portion 444 during a firing process for forming the second electrode 44. The electrode portion 444 is not well peeled off in both the case where it is proximate to the semiconductor substrate 160 and the case where it is disposed over the pad portion 442. In consideration of this, the entire pad portion 442 may first be formed so as to be proximate to the semiconductor substrate 160, and then a portion of the electrode portion 444 may be formed over the pad portion 442. However, the embodiment of the present invention is not limited thereto, and for example, the shape and stacking structure of the pad portions 442 and the electrode portion 444 may be changed in various ways.

In the present embodiment, the opening OP, which is formed in the electrode portion 444 so as to expose the pad portion 442, may have a width W2 smaller than the width W3 of the pad 442a (e.g., the opening OP may have the width W2 of the pad portion 442), and may have a length L2 greater than the length L1 of the pad 442a (measured in the first direction). Thereby, the electrode portion 444 is formed over the pad portion 442 on opposite sides of the pad 442a in the width direction so as to form the overlap portion 444b. The electrode portion 444 is spaced apart from the pad portion 442 on opposite sides of the pad 442a in the longitudinal direction so that the spacers S are located on opposite sides of the pad 442a in the longitudinal direction. That is, the spacer S, in which the pad 442a and the electrode portion 444 are not formed, is located on either side of the pad 442a in the longitudinal direction at a position between the pad 442a and the electrode portion 444.

When the pad 442a and the electrode portion 444 overlap each other in the width direction of the pad 442a, electrical connection may be improved. In addition, a portion of the wire 142, which does not come into contact with the electrode portion 444 due to the difference between the thicknesses of the pad 442a and the electrode portion 444, may be present in the longitudinal direction of the pad 442a between the pad 442a and the electrode portion 444. When the spacer S is formed in the non-contact portion, the manufacturing costs thereof may be reduced, and the wire 142 may be attached to the pad 442a using strong attachment force. This will be described below in more detail.

Referring to FIG. 7, the first thickness T1 of the pad 442a may be equal to or smaller than the second thickness T2 of the electrode portion 444. In particular, the first thickness T1 may be smaller than the second thickness T2. Because the pad 442a includes, as a main component, a material capable of increasing attachment force for the wire 142 (e.g. expensive silver), the pad 442a may be formed to have a relatively small thickness. In addition, because the electrode portion 444 includes a relatively cheap material, the electrode portion 444 may be formed to have a sufficient thickness so that the second electrode 44 has low resistance. In addition, the fire-through phenomenon acquired by the electrode portion 444 allows the second conductive area 30 to have a sufficient thickness so as to be formed at a sufficient area.

In one example, the first thickness T1 of the pad 442a may range from 5 μm to 15 μm, and the second thickness T2 of the electrode portion 444 may range from 30 μm to 40 μm. These thicknesses are limited so as to effectively perform the role of each layer. When the first thickness T1 ranges from 5 μm to 15 μm, excellent connection between the pad 442a and the wire 142 may be acquired. In addition, when the second thickness ranges from 10 μm to 40 μm, the fire-through phenomenon efficiently occurs, thus realizing low resistance.

Alternatively, the difference between the first thickness T1 and the second thickness T2 (e.g., the value acquired by subtracting the first thickness T1 from the second thickness T2) may range from 5 μm to 30 μm. Alternatively, the ratio of the first thickness T1 to the difference between the first thickness T1 and the second thickness T2 may range from 1:0.25 to 1:2, or the ratio of the second thickness T2 to the difference between the first thickness T1 and the second thickness T2 may range from 1:1 to 1:6. This range is limited to reduce manufacturing costs by reducing the first thickness T1 and to provide the second electrode 44 with low resistance by relatively increasing the second thickness T2.

However, the embodiment of the present invention is not limited thereto, and each of the first thickness T1 and the second thickness T2 may have various other values.

Accordingly, when viewed in cross section, the distance between the wire 142, which is attached to the electrode portion 444 or is placed over the electrode portion 444, and the semiconductor substrate 160 is gradually reduced with decreasing distance to the pad 442a until the wire 142 comes into contact with the pad 442a, and then is gradually increased with decreasing distance to the electrode portion 444. Accordingly, because the portion of the wire 142 on either side of the pad 442a has a gradually reduced or increased distance to the semiconductor substrate 160 in the second direction, the pad 442a may not be in contact with and be attached to this portion of the wire 142. In consideration of this, in the present embodiment, the spacers S, in which the electrode portion 444 and the pad 442a are not formed, may be located on opposite sides of the pad 442a in the second direction, in order to reduce manufacturing costs by reducing the area of the second electrode 44 without deterioration in the attachment between the pad 442a and the wire 142.

At this time, the length L3 of the spacer S in the second direction may have a value corresponding to the length of the portion, to which no wire 142 will be attached, in consideration of the difference between the first thickness T1 of the pad 442 and the second thickness T2 of the electrode portion 444. That is, as the difference between the first thickness T1 and the second thickness T2 is increased, the length L3 of the spacer S may be increased because the length of the portion, which cannot come into contact with the wire 142, is increased. Contrary, as the difference between the first thickness T1 and the second thickness T2 is reduced, the length L3 of the spacer S may be reduced because the length of the portion, which cannot come into contact with the wire 142, is reduced. In addition, the length L3 of the spacer S concerns with the width W of the wire 142 attached to the pad 442a. More specifically, when the width W of the wire 142 is small, the length L3 of the spacer S may be reduced in order to improve the attachment between the pad 442a and the wire 142. Contrary, when the width W of the wire 142 is increased, excellent attachment between the wire 142 and the pad 442a may be achieved even if the length L3 of the spacer S is increased.

In the present embodiment, the length L3 of the spacer S may be greater than the width W of the wire 142, may be greater than the difference between the thicknesses of the electrode portion 444 and the pad 442a, and may be greater than the width W2 of the overlap portion 444a in the first direction. Thereby, the length L3 of the spacer S may be sufficient to reduce the area of the second electrode 44, resulting in reduced manufacturing costs.

In one example, the length L3 of the spacer S may range from 0.5 mm to 3 mm. When the length L3 of the spacer S is below 0.5 mm, reduction in the area of the second electrode 44 may be insufficient, and therefore, it may be difficult to sufficiently reduce manufacturing costs. When the length L3 of the spacer L exceeds 3 mm, the pad 442a and the wire 142 may have difficulty in coming into contact with each other at a sufficient area.

In one example, the width W4 by which the overlap portion 444b and the pad 442a overlap each other may range from 0.05 mm to 2 mm. This range is limited to allow the overlap portion 444b and the pad 442a to overlap each other even if an alignment error occurs. In addition, when the width W4 is below 0.05 mm, the contact area between the overlap portion 444b and the pad 442a may be reduced, which may cause high contact resistance. When the width W4 exceeds 2 mm, material costs for the formation of the second electrode 44 may be increased, or the width of the pad 442a exposed through the opening OP may be insufficient, which may deteriorate the attachment between the pad 442 and the wire 142.

Alternatively, the ratio of the difference between the first thickness T1 and the second thickness T2 to the length L3 of the spacer S may range from 1:60 to 1:100. When the ratio is below 1:60, reduction in the area of the second electrode 44 may be insufficient, and it may be difficult to sufficiently reduce manufacturing costs. When the ratio exceeds 1:100, the pad 442a and the wire 142 may have difficulty in coming into contact with each other at a sufficient area. The ratio may range from 1:78 to 1:83 when further considering the contact area between the pad 442a and the wire 142 and manufacturing costs.

Alternatively, the ratio of the width W of the wire 142 to the length L3 of the spacer S may range from 1:10 to 1:15. When the ratio is below 1:10, reduction in the area of the second electrode 44 may be insufficient, and it may be difficult to sufficiently reduce manufacturing costs. When the ratio exceeds 1:15, the pad 442a and the wire 142 may have difficulty in coming into contact with each other at a sufficient area. The ratio may range from 1:12 to 1:14 when further considering the contact area between the pad 442a and the wire 142 and manufacturing costs.

Alternatively, the ratio of the width W4 of the overlap portion 444b to the length L3 of the spacer S may range from 1:1.5 to 1:60. This ratio may ensure the sufficient length L of the spacer S while minimizing the overlap portion 444b, thereby improving the attachment between the pad 442a and the wire 142. In one example, the ratio may range from 1:2 to 1:10. However, the embodiment of the present invention is not limited thereto, and various alterations are possible.

The length L1 of the pad 442a may be greater than the width W2 of the pad 442a, and may be determined to allow the wire 142 to be attached to the pad 442 at a sufficient area.

In one example, the ratio of the length L1 of the pad 442a to the portion of the wire 142 attached to the pad 442a may be 95% or more (e.g., within a range from 95% to 100%, e.g. 100%). Thereby, the wire 142 may be attached to the entire pad 442a, which may improve the attachment between the pad 442a and the wire 142 while minimizing the area of the pad 442a.

To this end, in one example, the length L1 of the pad 442a may range from 2 mm to 7 mm. When the length L1 is below 2 mm, the contact area between the pad 442a and the wire 142 may be excessively small. When the length L1 exceeds 7 mm, a portion of the pad 442a may not be attached to the wire 142.

Alternatively, the ratio of the length L1 of the pad 442a to the length L3 of the spacer may range from 1:0.03 to 1:0.45. When the ratio is below 1:0.03, reduction in the area of the second electrode 44 may be insufficient, and it may be difficult to sufficiently reduce the manufacturing costs thereof. When the ratio exceeds 1:0.45, the pad 442a and the wire 142 may have difficulty in achieving a sufficient contact area therebetween.

However, the embodiment of the present invention is not limited thereto, and for example, the ratio and the length L1 may be changed in various ways depending on the number of pads 442a.

The wire 142 may widely spread so as to have a rounded shape as the coating layer thereof (see reference numeral 142b in FIG. 3) spreads over each pad 442a, thereby being attached to the pad 442a (more particularly, a region of the pad 442a excluding the overlap portion 444b). Thereby, the width of a first portion of the wire 142 disposed over each pad 442a may be greater than the width of another portion (e.g., a second portion of the wire 142 disposed over the spacer S and the electrode portion 444). More specifically, the wire 142 has a consistent width on the spacer S, in which the pad portion 442 and the electrode portion 444 are not provided, and is spaced apart from the solar cell 150. In addition, because soldering between the wire 142 and the electrode portion 444 does not occur, or very slightly occurs, the wire 142 may be placed over the electrode portion 444 so as to have a consistent width without being fixed or attached to the electrode portion 444. That is, in the present embodiment, the wire 142 may be attached to only the pad 442a. However, the embodiment of the present invention is not limited thereto.

Referring to FIGS. 3 and 7, in the present embodiment, the second passivation film 32 may be disposed so as to correspond to a portion of the second electrode 44 excluding, for example, the proximate portion 444a of the electrode portion 444, e.g., to the portion between the pad 442a and the semiconductor substrate 160 and the spacers S). In addition, the second conductive area 30 may be formed so as to correspond to the remaining portion of the second electrode 44 (e.g. the proximate portion 444a in which the electrode portion 444 and the back surface of the semiconductor substrate 160 are proximate to each other), e.g., to the portion in which the pad 442a and the spacer S are not formed.

At this time, the third thickness T3 of the second passivation film 32 may be smaller than the first thickness T1 of the pad portion 442 and the second thickness T2 of the electrode portion 444. When the third thickness T3 is greater than the first thickness T1 and the second thickness T2, the fire-through process cannot be efficiently performed, which may deteriorate the connection between the proximate portion 444a of the electrode portion 444 and the second conductive area 32, and resistance may be increased due to the small thicknesses of the pad portion 442 and the electrode portion 444. Because the third thickness T3 is smaller than the first thickness T1 and the second thickness T2, the pad portion 442, which is disposed over the second passivation film 32, and the proximate portion 444a of the electrode portion 444, which is not disposed over the second passivation film 32, may be located so as to come into contact with each other on at least side surfaces thereof. In addition, the entire pad portion 442 may come into contact with the second passivation film 32, and the side surface of the second passivation film 32 may come into contact with the electrode portion 444.

In one example, the third thickness T3 may range from 5 nm to 30 nm. When the third thickness T3 is below 5 nm, sufficient passivation may not be achieved. When the third thickness T3 exceeds 30 nm, the fire-through process may be not efficiently performed.

As described above, because the area of the proximate portion 444a is relatively large, the area of the second passivation film 32, formed on the portion excluding the proximate portion 444a of the electrode portion 444, is smaller than the area of the second conductive area 30, which corresponds to the area of the proximate portion 444a. For example, assuming that the area of the semiconductor substrate 160 is 100%, the area of the second passivation film 32, which corresponds to the pad portion 442 and the spacers S, may range from 1% to 5% (e.g. from 2% to 3%).

This is because the electrode portion 444 includes a material, which can undergo a fire-through process, and the pad portion 442 includes a material, which cannot undergo the fire-through process, and therefore, during a firing process, the second passivation film 32 on the pad portion 442 and the spacer S remains, and the second passivation film 32 on the proximate portion 444a is removed, whereby the constitute material (or constituent material) of the proximate portion 444a diffuses to the back surface of the semiconductor substrate 160 so as to form the second conductive area 30.

In the present embodiment, the second electrode 44, disposed on the back surface of the semiconductor substrate 160, includes the pad portion 442 and the electrode portion 444, and the pad portion 442 and the electrode portion 444 are formed of different conductive materials, which may improve both the property required for the pad portion 442 and the property required for the electrode portion 444. At this time, when the spacer S is located in the longitudinal direction of the pad portion 442, the area of the second electrode 44 may be reduced, resulting in reduced manufacturing costs while ensuring the excellent attachment between the pad portion 442 and the wire 142.

In particular, when the wire 142 having a rounded portion as described above is used, shading loss attributable to diffused reflection may be minimized, and the movement path of carriers may be reduced by increasing the number of the wires 142 and reducing the pitch between the wires 142. Thereby, the efficiency of the solar cell 150 and the output of the solar cell panel 100 may be enhanced. However, in this case, the attachment between the wire 142 and the pad portion 442 may be deteriorated because the width and the thickness of the wire 142 are the same or similar to each other. In the present embodiment, even when the wire 142 having the structure described above is applied, excellent attachment may be maintained by limiting, for example, the dimension of the spacer S.

In addition, through the provision of the overlap portion 444b, the electrical connection between the pad portion 442 and the electrode portion 444 may be improved. In addition, the second passivation film 32 is located in a region excluding the proximate portion 444a of the electrode portion 444 so as to correspond to the portion between the semiconductor substrate 160 and the pad portion 442 and to the spacers S, which may result in improved passivation effects. In addition, when the second conductive area 30 is formed so as to correspond to the proximate portion 444a, the second conductive area 30 may be formed so as to have a sufficient area via a simplified method.

As is apparent from the above description, according to the present embodiment, an electrode includes a pad portion and an electrode portion, and the pad portion and the electrode portion are formed of different conductive materials, which may improve both the property required for the pad portion and the property required for the electrode portion. At this time, as a result of forming a spacer in the longitudinal direction of the pad portion, excellent attachment between the pad portion and a wire may be maintained, which may reduce the area of the electrode, and consequently, reduce manufacturing costs. In this way, the efficiency, productivity, and attachment of a solar cell and a solar cell panel including the same may be improved.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell comprising: a semiconductor substrate; a first doped area formed on a first surface of the semiconductor substrate, the first surface being incident to radiation; a second doped area formed on a second surface of the semiconductor substrate opposite the first surface; a first electrode connected to the first doped area; and a second electrode connected to the second doped area, wherein the second electrode includes a pad portion and an electrode portion the pad portion and the electrode portion being formed of different conductive materials, wherein the pad portion includes at least one pad extending in a first direction, wherein the electrode portion includes a through hole disposed within an interior of the electrode portion so as to be surrounded by the electrode portion, the through hole being disposed over the at least one pad; wherein the width of the through hole in a second direction orthogonal to the first direction is smaller than the width of the at least one pad in the second direction so that the electrode portion and the at least one pad overlap each other in the second direction forming an overlap portion, and wherein the length of the through hole in the first direction is larger than the length of the at least one pad in the first direction forming a spacer between the electrode portion and the at least one pad in the first direction.

2. The solar cell according to claim 1, wherein the overlap portion is located on either side of the at least one pad in the second direction, and the spacer is located on either side of the at least one pad in the first direction.

3. The solar cell according to claim 1, wherein the overlap portion has a width in the second direction, and the width of the overlap portion in the second direction is smaller than a length of the spacer in the first direction.

4. The solar cell according to claim 1, wherein the at least one pad includes a plurality of pads spaced apart from one another in the first direction so as to form a single row, and wherein the distance between two adjacent pads of the plurality of pads, is greater than the distance between an edge of the semiconductor substrate and a pad of the plurality of pads located closest to the edge.

5. The solar cell according to claim 1, wherein the at least one pad has a thickness less than a thickness of the electrode portion.

6. The solar cell according to claim 1, wherein the electrode portion and the at least one pad have a thickness difference less than a length of the spacer in the first direction.

7. The solar cell according to claim 6, wherein the thickness difference between the electrode portion and the at least one pad ranges from 5 .mu.m to 30 .mu.m, and wherein the length of the spacer in the first direction ranges from 0.5 mm to 3 mm.

8. The solar cell according to claim 7, wherein a ratio of the thickness difference between the electrode portion and the at least one pad to the length of the spacer ranges from 1:60 to 1:100.

9. The solar cell according to claim 1, further comprising a passivation film disposed on the second surface of the semiconductor substrate, wherein the passivation film is formed so as to correspond to the pad portion and the spacer, and wherein the second doped area is formed on a portion of the second surface not including the pad portion and the spacer.

10. The solar cell according to claim 1, wherein the first electrode includes a plurality of finger electrodes arranged in parallel in second direction and a plurality of bus-bar lines extending in the first direction, and wherein six to thirty-three bus-bar lines are provided on one surface of the solar cell.

11. A solar cell panel comprising: a plurality of solar cells; and a wire for interconnecting two neighboring solar cells among the solar cells, wherein each of the solar cells includes: a semiconductor substrate; a first doped area formed on a first surface of the semiconductor substrate, the first surface being incident to radiation; a second doped area formed on a second surface of the semiconductor substrate opposite the first surface; a first electrode connected to the first doped area; and a second electrode connected to the second doped area, wherein the second electrode includes a pad portion and an electrode portion the pad portion and the electrode portion being formed of different conductive materials, wherein the pad portion includes at least one pad extending in a first direction, the wire being attached to the pad, wherein the electrode portion includes a through hole disposed within an interior of the electrode portion so as to be surrounded by the electrode portion, the through hole being disposed over the at least one pad; wherein the width of the through hole in a second direction orthogonal to the first direction is smaller than the width of the at least one pad in the second direction so that the electrode portion and the at least one pad overlap each other in the second direction forming an overlap portion, and wherein the length of the through hole in the first direction is larger than the length of the at least one pad in the first direction forming a spacer between the electrode portion and the at least one pad in the first direction.

12. The solar cell panel according to claim 11, wherein the wire has a circular or oval cross section, or takes the form of a ribbon having a rectangular cross section.

13. The solar cell panel according to claim 11, wherein the wire connects the at least one pad, the spacer, and the electrode portion to one another.

14. The solar cell panel according to claim 11, wherein the wire has a width less than a length of the spacer in the first direction.

15. The solar cell panel according to claim 14, wherein a ratio of the width of the wire to the length of the spacer in the first direction ranges from 1:10 to 1:15.

16. The solar cell panel according to claim 11, wherein, within each solar cell, the wire includes a first portion disposed on the at least one pad and a second portion disposed on the spacer, and a width of the first portion is greater than a width of the second portion, and wherein at least 95% of the at least one pad is attached to the wire.

17. The solar cell according to claim 1, wherein six to thirty-three wires are provided on the first surface of each solar cell, and wherein each wire has a width ranging from 250 .mu.m to 500 .mu.m.

\* \* \* \* \*